United States Patent [19]

Merrill

[11] Patent Number: 4,506,280
[45] Date of Patent: Mar. 19, 1985

[54] TRANSISTOR WITH IMPROVED POWER DISSIPATION CAPABILITY

[75] Inventor: Perry L. Merrill, Mesa, Ariz.
[73] Assignee: Motorola, Inc., Schaumburg, Ill.
[21] Appl. No.: 576,764
[22] Filed: Feb. 2, 1984

Related U.S. Application Data

[63] Continuation of Ser. No. 377,237, May 12, 1982, abandoned, which is a continuation of Ser. No. 209,074, Nov. 21, 1980, , which is a continuation of Ser. No. 33,282, Apr. 25, 1979, abandoned.

[51] Int. Cl.³ .................. H01L 29/72; H01L 27/02; H01L 29/06
[52] U.S. Cl. ............................. 357/36; 357/20; 357/51
[58] Field of Search ............... 357/20, 34, 36, 51

[56] References Cited

U.S. PATENT DOCUMENTS

| 3,427,511 | 2/1969 | Rosenzweig | 357/34 |
| 3,609,460 | 9/1971 | Ollendorf | 357/36 |
| 3,619,741 | 11/1971 | Morgan | 357/51 |
| 4,038,680 | 7/1977 | Yagi et al. | 357/44 |
| 4,151,542 | 4/1979 | Yajima et al. | 357/36 |

OTHER PUBLICATIONS

Hamilton et al., *Basic Integrated Circuit Engineering*, McGraw-Hill, N.Y., (1975), pp. 45, 231-233.
Ghandhi, *Semiconductor Power Devices*, Wiley, N.Y., (1977), pp. 152-156.
Grove, *Physics and Technology of Semiconductor Devices*, Wiley, N.Y., (1967), p. 110.

Primary Examiner—Gene M. Munson
Attorney, Agent, or Firm—Robert M. Handy

[57] ABSTRACT

A bipolar power transistor with improved power dissipation capability. The device is designed to reduce the current crowding that obtains at the edge of a relatively wide emitter because of the debiasing effect of the voltage drop in the base region beneath that emitter. In a preferred embodiment, current crowding is reduced by sub-dividing a typical emitter finger into a central emitting region flanked by two peripheral emitting regions separated from the central region by a resistive portion. The resistive portions are desirably of the same conductivity type as the emitter; this design permits the use of relatively coarse geometries compatible with high yield.

1 Claim, 3 Drawing Figures

TRANSISTOR WITH IMPROVED POWER DISSIPATION CAPABILITY

This application is a continuation of application Ser. No. 377,237, filed May 12, 1982, abandoned, which is a continuation of application Ser. No. 209,074, filed Nov. 21, 1980, which is a continuation of Ser. No. 33,282, filed Apr. 25, 1979, abandoned.

SUMMARY AND BACKGROUND OF THE INVENTION

This invention is pertinent to semiconductor bipolar devices which operate in a high power mode for protracted periods of time relative to the thermal time constant of the semiconductor body itself. In the parlance of the technology, it is desirable to such a device to have a high forward-biased safe operating area. A typical bipolar power transistor is comprised of relatively wide emitter fingers or stripes which have a length long compared with their width. Base contacts are made on one or both sides of the stripe so that base current is supplied to the stripe through the base region underneath the stripe. Because the base region under the emitter must have relatively high resistivity in order to achieve practical values of current gain, there is a substantial voltage drop across the stripe as a result of base current flow. This drop can of course be minimized by reducing the width of the emitter stripe; this approach is a tradeoff with the desired objective of achieving as much active emitter area as possible within a given area of a semiconductor substrate. By reducing the emitter stripe width, relatively more semiconductor substrate area is required for the base contacts which flank the emitter stripe. Thus, to obtain reasonable values of emitter area to semiconductor substrate area, the stripes are usually made of such a width that there is a significant voltage drop in the base underneath the emitter across the width of the stripe. That is, the value of emitter current density is highest at the periphery and falls monotonically to the minimum value in the center of the stripe. If the emitter is too wide, its effective area will be reduced because of the diminished current density at its center. In practical designs, some diminution of the current density at the center of the stripe is allowed; the stripe width thus selected will often be on the order of or greater than the semiconductor substrate thickness, which thickness is generally minimized in order to reduce the thermal resistance of the substrate. When a device is operated at high power densities for periods of time long compared to its thermal time constant, the non-uniform current density will cause inhomogeneous heating of the device. This inhomogeneous heating of the device can then cause local increases in the value of the current density due to thermal regeneration whereby the power density is even further increased. This result obtains because of the exponential dependence of the collector current density on the local temperature for constant local base emitter voltage. This effect is regenerative because increased current causes increased power and hence further increases in temperature which lead to yet further increases in power. The literature is replete with techniques aimed in reducing this effect. One well-established technique is to introduce series resistance into the base-emitter current path of the device. This technique is most effective when the resistance is introduced in a distributed fashion so that the local current must flow through the local distributed resistance. Clearly, if the local resistance is sufficiently high, the local base-emitter current remains relatively constant. Since the current gain (that is, the collector current divided by the base current) is a relatively slow function of the temperature, the distributed resistance technique is very effective in terms of limiting the local current density. One of the ways in which the distributed resistance can be introduced into the base-emitter path is by placing it in series with the emitter of the device and the emitter metallization means. This has the decided disadvantage that the collector current flow through this resistance will drastically increase the saturation voltage of the device. Another way in which the series resistance can be introduced is by placing it between the edge of the emitter and the base metallization means in contact with the base of the transistor. While this has the advantage of taking the resistance out of the emitter collector current path, this technique too can lead to increased saturation voltages because the base current would prefer to flow into the collector at low values of collector voltage rather than flow through the relatively high distributed resistance in the emitter-base current path.

The distributed resistance techniques recited hereinbefore are most effective when the emitter stripe width is sufficiently narrow that the power density does not vary appreciably across the stripe. That is, they tend to render the average power dissipation uniform down the long dimension of the stripe. It is an object of this invention to provide a device configuration which will minimize the thermal concentration problem across the width of the stripe itself while avoiding some of the increased saturation voltage problems associated with known techniques. It is a further object of this invention to allow the use of relatively wide emitter stripes while avoiding thermal runaway at the edges of the stripes themselves. It is yet another object of this invention to homogenize the power density across the width of an emitter stripe without requiring the use of resistance-introduction techniques which involve the use of fine geometries which inevitably reduce the yield in a semiconductor device. It is yet another object of the invention to provide a technique which can be used in conjunction with known techniques for homogenizing the power distribution down the long dimension of an emitter stripe.

To achieve the above objects, there is described a design which effectively subdivides the narrow dimension of the emitter stripe into a central region flanked by two peripheral regions, which peripheral regions are separated from the central region by an intervening resistive layer. This resistive layer preferably is composed of semiconductor material having the same conductivity type as that of the emitter. By the use of this design, there is a tendency to maintain a more nearly constant emitter-base voltage across the width of the emitter stripe because the lateral voltage drop in the base region beneath the emitter is balanced by a desirably equal but opposite voltage drop across an emitter stripe which is contacted only near its central portion. This technique is distinguishable from distributed resistance techniques utilizing the sheet resistance of an emitter-like region because it is practically impossible to devise emitter and base regions having equal but opposite voltage drops while maintaining desirable values of current gain. That is, compensation of the voltage drops requires that the ratio of the base sheet resistance under the emitter to the emitter sheet resistance be on the order of the current gain, e.g. 100:1, while achieving such typical value of current gain requires a ratio of base sheet resistance under the emitter to emitter sheet resistance on the order of 1000:1 or greater. While exotic geometrical techniques can be used to overcome the inherently undesirable sheet resistance ratio, these techniques are impractical in the sense that they undesirably increase the complexity of the device leading to lower yields, and/or result in a device which has a drastically reduced ratio of effective emitter area to total semiconductor substrate area.

DETAILED DESCRIPTION OF THE PREFERRED EMBODIMENT

The invention will be described by a general description of the prior art together with a detailed discussion of how to modify the prior art in order to achieve the objects of the invention as hereinbefore described.

Figure 1:
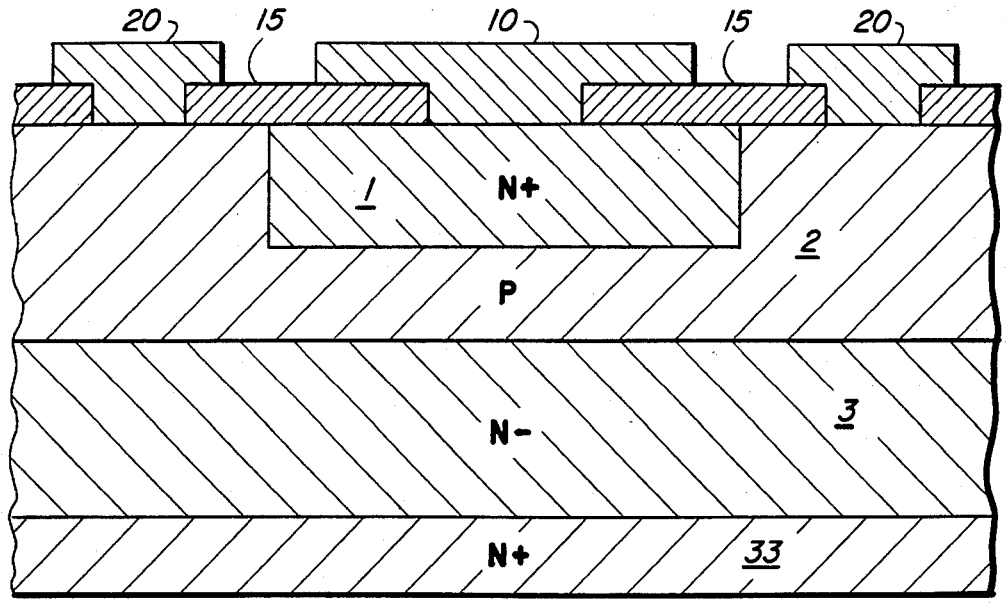
FIG. 1 is a cross-section of a known configuration of a bipolar power transistor showing details of a rather typical emitter stripe and its associated base region including the metallic contacts thereto.

FIG. 1 is a cross-section of a rather typical prior art power transistor configuration showing a single emitter stripe with its associated base. With a single emitter stripe 1 and metallic contact means 10 thereto together with base metallic contact means 20 flanking the emitter stripe. While not shown in top view it will be appreciated that the entire device is comprised of a number of similar emitter stripes and intervening base contacts placed side by side; each emitter stripe has a length into the drawing sheet which is typically several times the emitter width $W_E$ depicted in FIG. 1. Base current enters the device through metallic contacts 20 and flows laterally beneath the emitter stripe 1 through base region 2. Because of the voltage drop associated with the base current flow beneath the emitter region, the emitter current density is highest at its outer extremities and tapers monotonically to a minimum value in the center of the stripe. The voltage drop across the device is primarily sustained in a depletion layer formed by the PN junction between base region 2 and collector region 3. This voltage drop is typically much higher than any lateral voltage drops in the device and hence the voltage is relatively constant across the emitter stripe 1. Thus the power density is highest at the lateral edges of emitter stripe 1 and tapers to a minimum value at its center. When the emitter stripe width $W_E$ is on the order of or larger than the thickness of the semiconductor substrate 100, this inhomogeneous power dissipation will cause the temperature at the lateral edges of the emitter stripe 1 to become substantially elevated with respect to the temperature at its center. At a certain local temperature, there is initiated a condition whereby regenerative increases in the emitter collector current will occur unless some provision is made to limit the amount of current which can flow in either or both the emitter base and collector emitter circuits. Even if the total base current or collector current is constrained, local heating may result in the condition whereby large amounts of current concentrate at the hottest portion of the device thereby leading to yet further heating, and eventually to thermal destruction of the device.

Figure 2:
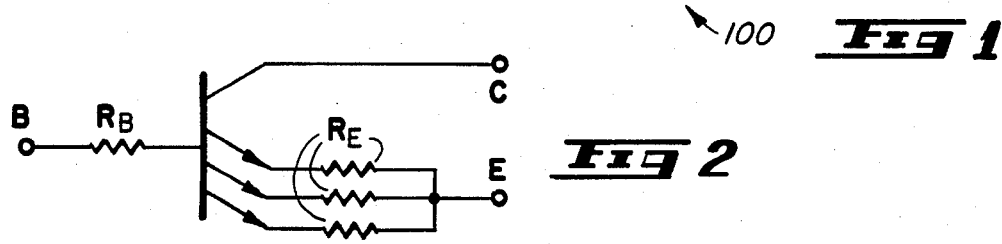
FIG. 2 is illustrative of known improvements to a basic design like that of FIG. 1 by adding discrete or distributed resistances in the base-emitter current path.

FIG. 2 is the circuit representation of the device of FIG. 1 showing the deliberate introduction of series resistance in the base emitter current path of the transistor. This resistance may be introduced in a discrete form, as shown by the multiple emitters of the device in FIG. 2 or, in the alternative may tend to have a distributed character as shown by the single resistor in series with the base of the device. The introduction of discrete resistors is tantamount to the provision for a number of small transistors each having its own individual resistor in order to limit the amount of current passing through the local emitter site. Distributed resistance can be introduced, for example, by limiting the amount of contact between either or both the emitter region 1 and base region 2 and their associated metallic contacts 10 and 20 in FIG. 1 and/or by increasing the resistivity of the semiconductor material in the current path. Whether in discrete or distributed form, the provision of additional resistance is most effective in minimizing the variation of current density and hence the maximum temperature down the long dimension of the emitter stripe such as 1 in FIG. 1. To the extent that the emitter contact to its metallization means 10 is constricted by narrowing the area of contact to the extreme center of the emitter, there will be a tendency to balance the current density across the width of the emitter stripe 1 because the voltage drop of the emitter current falling laterally from the center of the emitter flowing in the emitter laterally from the center of the emitter tends to offset the lateral voltage drop in the base. However, the compensation is not ordinarily very accurate because the base sheet resistance under the emitter may be on the order of 3000 ohms per square while the emitter sheet resistance may be on the order of 3 ohms per square, that is, a ratio of 1000:1. If the current gain of the device is on the order of 100:1, it will be seen that very little compensation across the width of the stripe is achieved. That is, the power density will still be highest at the edges of the emitter stripe and the temperature that triggers the thermal instability will be determined accordingly.

Figure 3:
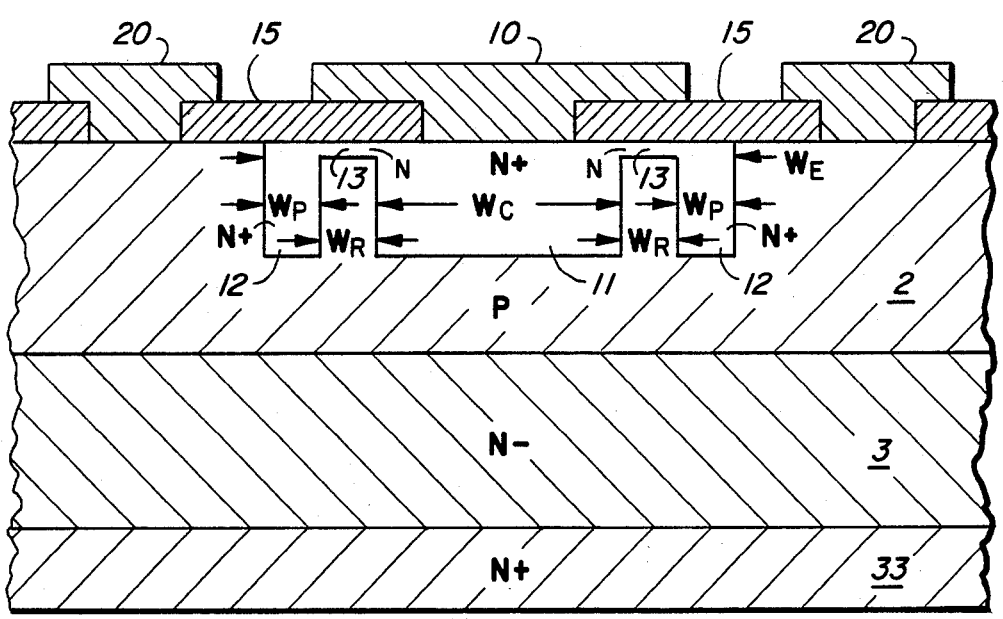
FIG. 3 is a preferred embodiment of the present invention wherein an emitter stripe is separated into a mutiplicity of regions in a direction parallel to the base current flow.

In order to limit the peak local temperature at a given total emitter current, it is desirable to reduce the variation in emitter current density across the width of the emitter stripe 1. A preferred embodiment according to this invention for achieving reduced local temperatures is illustrated in FIG. 3. Like FIG. 1, FIG. 3 shows a cross-section of a typical emitter stripe. Base region 2, collector region 3 and collector contact region 33 are unchanged from the corresponding regions in FIG. 1. The omitter portion of the structure, however, is divided into several portions. In the embodiment of FIG. 3, these portions comprise a central portion 11 flanked by two peripheral portions 12. The two regions 13 of the same conductivity type as the emitter (in this illustrative case of N-type conductivity) are of higher sheet resistance than emitter portions 11 and 12. Metallic emitter contact means 10 is restricted to the central portion of the emitter; that is, it does not contact the two peripheral portions 12. That portion of the emitter current which emanates from the two emitter portions 12 thus must flow through the resistive portions 13. In the illustration, the restriction of the metallic contact is achieved by means of an insulator 15 which is opened only over the central portion 11 of the emitter; other techniques are possible.

The process for achieving the structure shown in FIG. 3 is briefly outlined. Collector region 3 is of high resistivity and base region 2 of somewhat lower resistivity is formed on collector region 3, for example by diffusion or epitaxial growth. Region 2 has sheet resistance on the order of 200 ohms per square although higher or lower values may be used. Emitter portions 11 and 12 are formed simultaneously, typically by diffusion, and there is no geometrical criticality because the regions 11 and 12 result from multiple apertures formed in the same masking step. A typical value for the sheet resistance of the primary emitter regions is on the order of 3 ohms per square, so again higher or lower values may be used in accordance with well-known transistor design principles. Resistive regions 13 are formed by an additional doping step; the sheet resistance achieved by this step may be on the order of 100 ohms per square depending on the relative dimensions and spacing of the major emitter portions and the base sheet resistance under the emitter. Since the doping step which produces resistive regions 13 need not be restricted only to those regions, i.e. the doping could go into major emitter portions 11, 12 or even overlap into the surrounding base region 2, geometrical criticality is avoided for the second step requisite for the formation of the composite emitter structure. The transistor structure is completed by the formation of metallic contact means 10 and 20 by techniques well known in the art.

The total width $W_E$ in FIG. 3 is commensurate with that of the simpler emitter structure 1 in FIG. 1. Where the device is compared by data hereinafter presented, $W_E$ was 11 mils. The width $W_C$ of the central portion of the emitter in FIG. 3 was 4 mils and that of the peripheral portions and the width $W_P$ of the peripheral portions was 2 mils. The spacing between the central and the peripheral portions $W_R$ is chosen in accordance with conventional design techniques and the dimensions of the emitter portions of the composite emitter in FIG. 3 are not especially critical, so that the embodiment is completely compatible with rather imprecise photolithographic techniques which are a typical concomitant of the high yield process.

A measure of the efficacy of the composite and emitter structure of FIG. 3 is given by comparison of the electrical data obtaining for that design as compared with the design of FIG. 1. Because of the reduction in effective emitter width of the composite design, its current carrying capability (as measured by the current at which a specified current gain is obtained in the region where current gain falls rapidly with collector current) is reduced by about 20%, which roughly corresponds to the geometrical reduction in the emitter area. However, despite this effective reduction in emitter area, the composite emitter structure exhibited a marked enhancement of forward-biased safe operating area. For the devices compared, safe operating area was ascertained by measuring the amount of current which would flow at a collector emitter voltage of 60 volts without engendering destructive thermal runaway. For a conventional device as typified by FIG. 1, this value is found to be 0.5 ampere, whereas for the composite emitter structure of FIG. 3, otherwise identical in construction to the device of FIG. 1, the forward-bias safe operating area was increased by a factor of 2 to 1 ampere.

While specific construction dimensions have been described by way of a preferred embodiment, this invention has been found to be applicable to other fabrication sequences and emitter widths so long as the emitter width is sufficiently large that the desired partition can be achieved. The invention described may be combined with other structural features for achieving improved safe operating area such as distributed base resistance or tapered base and emitter stripes.

I claim:

1. A semiconductor device comprising:

a base region of a first conductivity type and a first conductivity;

an emitter region of a second conductivity type and a second conductivity, formed in said base region and extending to a first surface of said semiconductor device, and divided by said base region into an active central portion and an active peripheral portion flanking said central portion, wherein said central and peripheral portions have the same first depth into said base region, wherein said emitter is substantially stripe-shaped, wherein said central portion comprises a central stripe, wherein said peripheral portion comprises first and second peripheral stripes lying on either side of said central stripe, wherein said central portion has a transverse width substantially equal to the transverse width of said peripheral portion, and wherein said central portion has sufficient area relative to said peripheral portion that a substantial part of the emitter current flows into said base region directly from said central portion of said emitter;

a resistor region of the same conductivity type as said emitter region, formed in said base region and extending to said first surface and of a second depth into said base region less than said first depth, and bridging between said central portion and said peripheral portion; and an emitter electrode in contact with said emitter region only in said central portion.

* * * * *